United States Patent
Kämäräinen

(10) Patent No.: US 9,548,402 B2
(45) Date of Patent: Jan. 17, 2017

(54) SEMICONDUCTOR RADIATION DETECTOR WITH LARGE ACTIVE AREA, AND METHOD FOR ITS MANUFACTURE

(71) Applicant: Oxford Instruments Analytical Oy, Espoo (FI)

(72) Inventor: Veikko Kämäräinen, Helsinki (FI)

(73) Assignee: Oxford Instruments Analytical Oy, Espoo (FI)

( * ) Notice: Subject to any disclaimer, the term of this patent is extended or adjusted under 35 U.S.C. 154(b) by 23 days.

(21) Appl. No.: 14/563,105

(22) Filed: Dec. 8, 2014

(65) Prior Publication Data

US 2015/0162455 A1 Jun. 11, 2015

(30) Foreign Application Priority Data

Dec. 9, 2013 (EP) .................................... 13397545

(51) Int. Cl.
| | |
|---|---|
| *G01T 1/24* | (2006.01) |
| *H01J 37/244* | (2006.01) |
| *H01L 31/02* | (2006.01) |
| *H01L 31/0203* | (2014.01) |
| *H01L 31/024* | (2014.01) |
| *G01J 1/44* | (2006.01) |
| *H01L 31/18* | (2006.01) |

(52) U.S. Cl.
CPC ............ *H01L 31/02002* (2013.01); *G01J 1/44* (2013.01); *G01T 1/24* (2013.01); *H01J 37/244* (2013.01); *H01L 31/0203* (2013.01); *H01L 31/024* (2013.01); *H01L 31/18* (2013.01); *G01J 2001/4446* (2013.01); *H01J 2237/2442* (2013.01)

(58) Field of Classification Search
CPC ............... G01T 1/36; G01T 1/00; H01L 25/00
See application file for complete search history.

(56) References Cited

U.S. PATENT DOCUMENTS

| | | | | |
|---|---|---|---|---|
| 2006/0208189 | A1* | 9/2006 | Vilain | G01J 5/20 250/339.04 |
| 2008/0224054 | A1* | 9/2008 | Lehmann | G01T 1/2018 250/370.01 |
| 2010/0289129 | A1* | 11/2010 | Chinnusamy | H01L 23/49524 257/676 |
| 2011/0139987 | A1* | 6/2011 | Kromer | H01J 37/244 250/336.1 |
| 2011/0298064 | A1* | 12/2011 | Pahl | B81B 7/0048 257/415 |

(Continued)

*Primary Examiner* — Mohsen Ahmadi
*Assistant Examiner* — Gustavo Ramallo
(74) *Attorney, Agent, or Firm* — Harrington & Smith

(57) ABSTRACT

A semiconductor radiation detector comprises a detector chip having a front side and a back side, and a support plate on the back side of the detector chip, having electric connections with said detector chip. A base plate has a thermoelectric cooler attached to it and contact pins protruding from the base plate towards said detector chip. A bonding plate is on an opposite side of said thermoelectric cooler than said base plate, and first wire bonded connections go between said contact pins and said bonding plate. A joint plate is between said bonding plate and said support plate, and electric connections between said support plate and said bonding plate go through said joint plate.

10 Claims, 3 Drawing Sheets

(56) References Cited

U.S. PATENT DOCUMENTS

| | | | |
|---|---|---|---|
| 2012/0228498 A1* | 9/2012 | Scheid | H01L 27/14618 250/336.1 |
| 2015/0162455 A1* | 6/2015 | Kamarainen | H01L 31/02002 257/459 |

* cited by examiner

SEMICONDUCTOR RADIATION DETECTOR WITH LARGE ACTIVE AREA, AND METHOD FOR ITS MANUFACTURE

TECHNICAL FIELD

The invention concerns in general the structures of semiconductor radiation detectors. More particular embodiments concern the construction of a semiconductor radiation detector in which the detector chip may utilize as much of the available space as possible.

BACKGROUND OF THE INVENTION

Effective operation of certain semiconductor radiation detectors, such as PIN diode (p-type—intrinsic—n-type) detectors and SDDs (silicon drift detectors), benefits from sealing the detector crystal and its immediate electric contacts in a gas-tight enclosure known as the detector can. In some applications the semiconductor radiation detector may be located at the end of an elongated pipe, which points towards the sample holder of a micro-analyzer. A radiation window at the front face of the detector can or pipe allows radiation to enter, while the back side of the detector assembly has the attachment means and contact pins that are needed to couple the detector mechanically, electrically, and thermally to the radiation-detecting appliance. A thermoelectric cooler, such as a Peltier element, is typically included in the entity, which in assembled form is frequently referred to as the detector head.

FIG. 1 illustrates a prior art detector head. The detector chip 101 is attached to a substrate 102, which in turn is attached to a thermoelectric cooler 103. A base plate 104 with a protruding attachment bolt 105 supports the arrangement and closes the bottom of the detector can 106, the front face of which has an opening covered by a radiation window 107. The graphical illustration is simplified and omits possible intermediate shielding layers and other features that are not essential for understanding the background of the present invention.

Contact pins 108 go through holes in the base plate 104, and are electrically isolated therefrom by insulator sleeves 109. The entity that consists of the base plate 104, the attachment bolt 105, the contact pins 108, and the insulator sleeves 109 is sometimes called the header. A bonding wire 110 connects the top end of each contact pin 108 to a bonding pad 111 on the top surface of the substrate 102. Further bonding wires (not shown) may constitute the electric connections between areas of the substrate 102 and respective contact pads on the detector chip 101. The choice of just wire bonding as the technology of making the electric connections involves the inherent advantage of low thermal conductivity; for example, it is essential that as little heat as possible flows from the contact pins 108 to the substrate 102 and further to the detector chip 101.

The sensitivity of the detector is in principle better with larger detector chips: the larger surface of the detector chip collects more photons, increasing the pulse frequency. In the arrangement of FIG. 1 the substrate 102, and thus also the detector chip 101, must be smaller in diameter than the circle formed by the contact pins 108, because the bonding wedge must be able to touch the top ends of the contact pins, as well as the bonding pads on the substrate 102 and detector chip 101, from above. Basically it would be possible to make the whole detector head larger in diameter, but that would make it more difficult to place it close to the sample from which originates the radiation to be detected. The diameter of the ring of contact pins must always be significantly smaller than the diameter of the base plate, because hermetically sealing and electrically insulating the contact pin holes in the base plate necessitate the use of an insulator sleeve that completely encircles the contact pin and has a certain minimum wall thickness, and because some base plate metal must remain between the holes for the insulator sleeves and the base plate edge.

FIGS. 2 and 3 illustrate known detector heads that aim at avoiding the size-limiting effect of the circle of contact pins. The structure of FIG. 2 is known from the patent publication EP 2286275. The bonding is made from the side, so the bonding wire 210 connects the side surface of the contact pin 208 to a bonding pad 211 located on a vertical surface of the substrate 202. In this arrangement the contact pins are shorter than in the arrangement of FIG. 1, and the upper limit for the diameter of the substrate 202 (and consequently, to almost the same extent, for the diameter of the detector chip 201) is determined by the diameter of the circle of contact pins plus the marginal difference allowed by the bonding. In practice one may say that it is the diameter of the circle of contact pins that defines the maximum diameter of the substrate.

The structure of FIG. 3 is known from the patent publication US 2012/0228498. The detector chip 301 is flip-chip-bonded to a first substrate 302, under which is a second substrate 312, the outer edge of which defines cavities. For connections to and from the contact pins, bonding wires 310 go between the top ends of the contact pins 308 and bonding pads (not separately shown) located in said cavities. Bonding to the top side of the detector chip 301 is typically also needed, although not shown in FIG. 3. The diameter of the second substrate 312 must be smaller than that of the circle of contact pins, but the diameter of the first substrate 302 and the detector chip 301 can be of the same size or even larger than the diameter of the circle of contact pins. Disadvantages of this structure include the relatively complicated three-dimensional form of the second substrate, as well as the small and three-dimensionally limited space available in the cavities for making the wire bonding.

A need exists for detector head structures that would enable the detector chip to have a large area while simultaneously making the structure easy to manufacture and reliable in use.

SUMMARY OF THE INVENTION

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with a first aspect of the invention, there is provided a semiconductor radiation detector that comprises:
a detector chip having a front side and a back side,
a support plate on the back side of the detector chip, having electric connections with said detector chip,
a base plate having a thermoelectric cooler attached to it and contact pins protruding from the base plate towards said detector chip,
a bonding plate on an opposite side of said thermoelectric cooler than said base plate, first wire bonded connections between said contact pins and said bonding plate,
a joint plate between said bonding plate and said support plate, and
electric connections between said support plate and said bonding plate through said joint plate.

In accordance with a second aspect of the invention, there is provided a method for manufacturing a semiconductor radiation detector. The method comprises:
attaching a detector chip to a support plate,
making electric connections between said detector chip and said support plate,
making wire bonded connections between a bonding plate and contact pins in a sub-assembly that comprises a base plate, a thermoelectric cooler attached to it, and said contact pins protruding from the base plate and
using an intermediate joint plate to mechanically and electrically connect said support plate to said bonding plate.

As a technique for making electric connections, wire bonding with a bonding wedge has many very advantageous features. For example, the bonding wire may bridge gaps (i.e. the two contact points to be electrically coupled need not come into close contact with each other); the thermal conductivity of the connection is small despite its good electric conductivity; and the bonding may be made very accurately, allowing the contact points to be relatively small. However, wire bonding has also its limitations. A solely wire bonded connection cannot carry any significant mechanical loads; the two contact points to be coupled must be freely accessible from a common direction; and they must not have very much mutual difference in height. Glueing (with an electrically conductive glue) and soldering produce a mechanical attachment as well as an electric coupling, but they are spatially not as accurate as wire bonding, and they also result in significant thermal conductivity over the attachment.

Assembling a semiconductor radiation detector according to an embodiment of the present invention combines the advantageous features of several techniques. Wire bonding is used in the manufacturing of two sub-assemblies, which are mechanically and electrically connected together with a different technique, such as glueing and/or soldering. The last-mentioned attachment techniques are strong enough to mechanically keep the parts of the assembled detector together, and the use of a joint plate allows forming the contact points so freely that the more limited accuracy of glueing or soldering does not matter. The interfaces where glueing and/or soldering are used are those where good thermal conductivity is an asset rather than a drawback, because it serves the purpose of cooling the detector chip. The use of a separate joint plate also allows using very simple geometric appearances of the various parts, which simplifies manufacturing and yet allows forming cavities in the structure that may house electronic components attached to the surfaces of the parts.

The exemplary embodiments of the invention presented in this patent application are not to be interpreted to pose limitations to the applicability of the appended claims. The verb "to comprise" is used in this patent application as an open limitation that does not exclude the existence of un-recited features. The features recited in depending claims are mutually freely combinable unless otherwise explicitly stated.

The novel features which are considered as characteristic of the invention are set forth in particular in the appended claims. The invention itself, however, both as to its construction and its method of operation, together with addi-tional objects and advantages thereof, will be best understood from the following description of specific embodiments when read in connection with the accompanying drawings.

DETAILED DESCRIPTION OF EMBODIMENTS OF THE INVENTION

Figure 1:
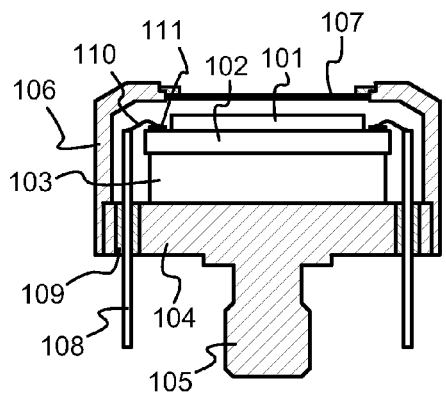
FIG. 1 illustrates a detector head according to prior art.
Figure 2:
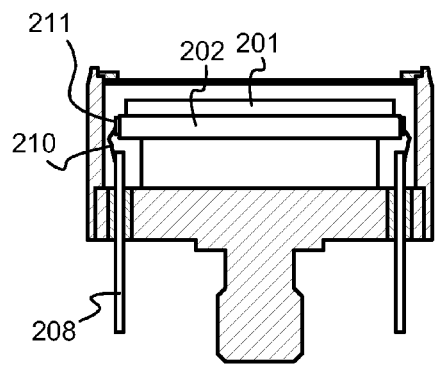
FIG. 2 illustrates another detector head according to prior art.
Figure 3:
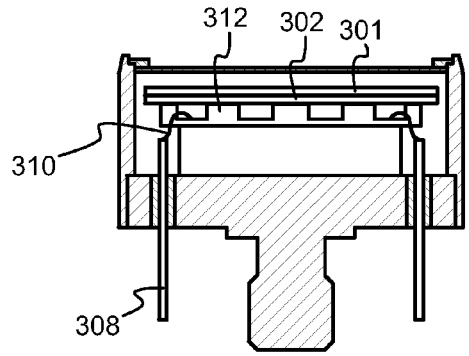
FIG. 3 illustrates another detector head according to prior art.
Figure 4:
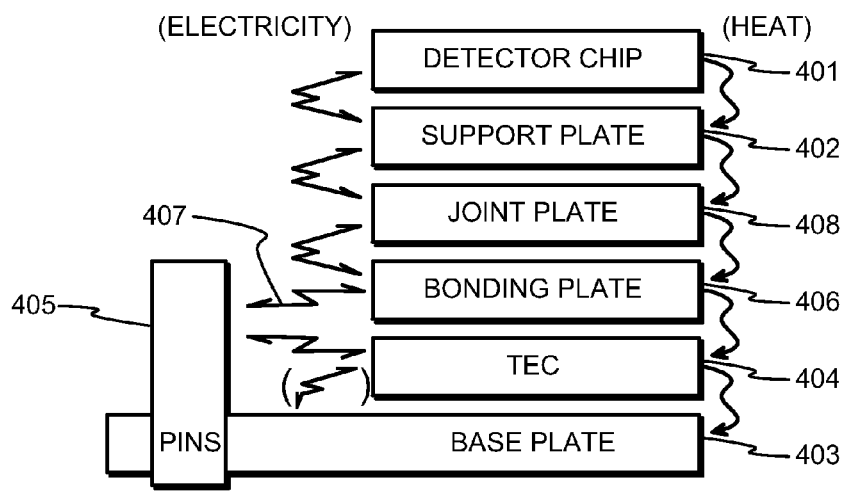
FIG. 4 illustrates a structural principle of a semiconductor radiation detector.

FIG. 4 is a principal illustration of main structural parts in a semiconductor radiation detector according to an embodiment of the present invention. The semiconductor radiation detector comprises a detector chip 401, which has a front side and a back side. In this description we use the designation "front side" for the surface of the detector chip that is meant to receive the radiation to be detected, and that is visible in the assembled semiconductor radiation detector (unless the detector is enclosed in a detector can or other type of outer casing that has a non-transparent radiation entrance window). Correspondingly the back side of the detector chip, in the vocabulary of this description, is the side by which the detector chip is attached to the other parts of the detector head. This choice of vocabulary should not be confused with the customary way of calling the patterned surface of a semiconductor wafer its front side, and the opposite surface of the wafer its back side. In the principal illustration of FIG. 4 the front side of the detector chip 401 is upwards.

As illustrated in FIG. 4, the semiconductor radiation detector comprises a support plate 402 on the back side of the detector chip 401. Electric connections are schematically shown with jagged arrows on the left in FIG. 4, so the support plate 402 has electric connections with the detector chip 401. We will describe some advantageous forms of making such electric connections in more detail later.

At the bottom of the principal structure illustrated in FIG. 4 is a base plate 403. It has a thermoelectric cooler (TEC) 404 attached to it. Contact pins 405 protrude from the base plate 403 towards the side on which the detector chip 401 is located, which is upwards in FIG. 4.

The semiconductor radiation detector comprises a bonding plate 406 on the opposite side of the TEC 404 than the base plate. Electric connections are made between the contact pins 405 and the bonding plate 406, as illustrated with arrow 407. It is advantageous to make these electric connections by wire bonding, and for the sake of unambiguous verbal designations we may say that these connections constitute "first" wire bonded connections (as a difference to "second" wire bonded connections elsewhere in the structure). The descriptors "first" and "second" are used solely for unambiguous literal reference, and they carry no connotations about e.g. which of these connections should be made first or second in the manufacturing process.

The electric connections that are used to operate the TEC 404 come primarily through dedicated ones of the contact pins 405. Some form of electric connection may also exist between the TEC 404 and the base plate 403, for example for coupling the TEC 404 to a ground potential of the analyzer device to which the semiconductor radiation detector is attached.

The semiconductor radiation detector comprises a joint plate 408 between the bonding plate 406 and the support plate 402. Electric connections between the support plate 402 and the bonding plate 406 go through the joint plate 408. The joint plate 408 also constitutes a mechanical intermediate layer in the stack of plates, so that in the completely assembled semiconductor radiation detector the support plate 402 is attached to the joint plate 408, which in turn is attached to the bonding plate 406.

Figure 5:
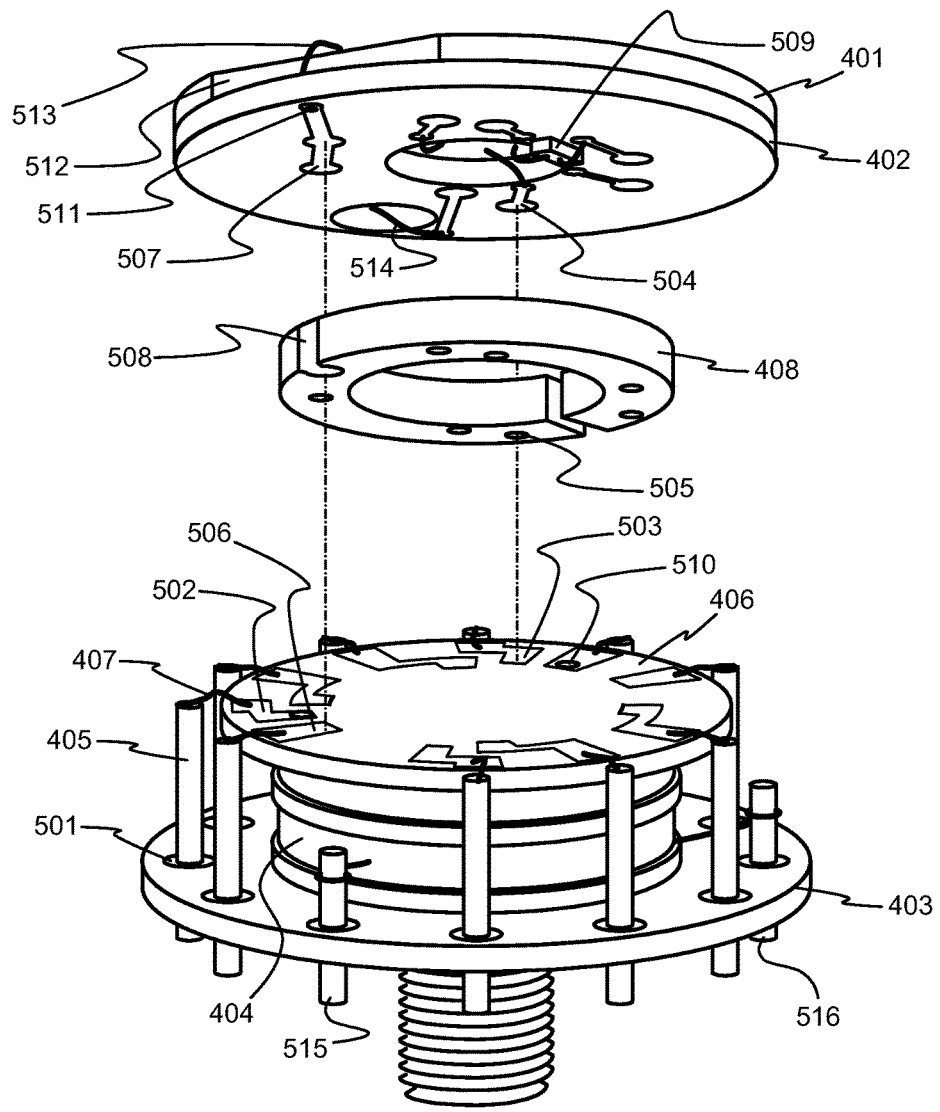
FIG. 5 illustrates a semiconductor radiation detector according to an embodiment of the invention.

FIG. 5 is a partially exploded view of a semiconductor radiation detector according to an embodiment of the invention. A detector chip 401 is the topmost part, which in FIG. 5 is largely hidden from view by the support plate 402 that is attached to the back side of the detector chip 401. A base plate 403 has a TEC 404 attached to it. Contact pins 405 protrude from the base plate 403 towards the detector chip 401. Insulator sleeves 501 provide electric insulation between the contact pins 405 and the base plate 403. First wire bonded connections 407 connect the upper ends of at least some of the contact pins 405 to respective first contact pads 502 on the front surface (=upper surface in FIG. 5) of the bonding plate 406. Not all contact pins need to be connected anywhere, for example if the overall appearance of the detector must comply with a certain standard that requires a standardized number of contact pins, but not quite as many electric connections are needed for operating the detector.

The joint plate 408 has the form of an annular ring in FIG. 5, for purposes that will be explained in detail later. A cut in the annular ring ensures that it does not form a closed pocket that could hold air and cause trouble if the detector is subjected to vacuum pumping. The two dash-dot lines show how certain points in the support plate 402, the joint plate 408, and the bonding plate 406 are aligned for assembling the semiconductor radiation detector.

Figure 6:
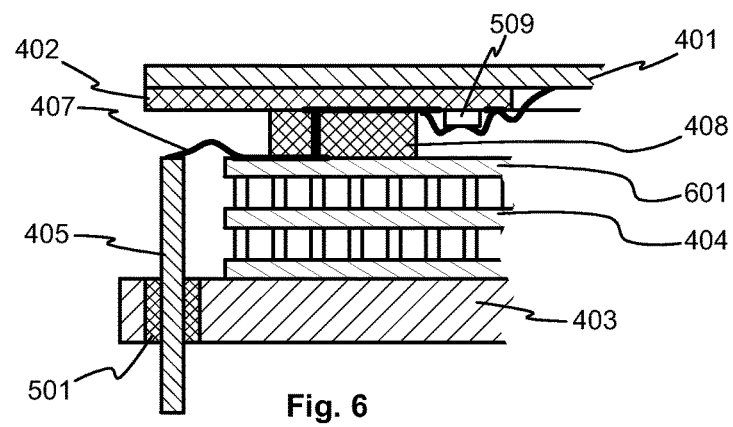
FIG. 6 is a cross section of a part of a semiconductor radiation detector according to an embodiment of the invention.

FIG. 5 also illustrates two possible ways of implementing electric connections between the support plate 402 and the bonding plate 406 through the joint plate 408. The electric connection between a first conductive track 503 on the front surface of the bonding plate 406 and a second conductive track 504 on the back surface of the support plate 402 goes through a conductive via 505 in the joint plate 408; a cross section of a corresponding arrangement is also shown in FIG. 6. In comparison, the electric connection between a third conductive track 506 on the front surface of the bonding plate 406 and a fourth conductive track 507 on the back surface of the support plate 402 goes through a (fifth) conductive track 508 on a surface of the joint plate 408. In this example the fifth conductive track 508 goes around the outer edge of the joint plate 408, so that its first end on the back surface of the joint plate 408 comes against the third conductive track 506, and its second end (which is not visible in FIG. 5) on the front surface of the joint plate 408 comes against the fourth conductive track 507 in the assembled semiconductor radiation detector.

The semiconductor radiation detectors that are illustrated in FIGS. 5 and 6 comprise an electronic component 509 attached to the opposite side of the support plate 402 than the detector chip 401. The electronic component 509 may be for example a FET (field-effect transistor) that is used as a low-noise preamplifier of the detector chip 401. In more general terms the electronic component may be an integrated preamplifier circuit, but for brevity it is common on this technical field to just speak about a FET. In order to minimize interference it is advantageous to have the FET as close to the detector chip 401 as possible. It is possible to even build the FET and/or other preamplifier circuitry within the same block of semiconductor material that also constitutes the semiconductor chip, but since the semiconductor materials used for radiation detectors have different requirements than those used for field-effect transistors, in many cases it is advantageous to use a separate FET.

In some cases it is possible to attach a separate FET directly onto a surface of the detector chip, but in order to illustrate certain viewpoints concerning the appearance of the joint plate 408 we assume that the FET (or other electronic component 509) is not only attached to the support plate 402 but also breaks the otherwise planar back surface of the support plate 402; in other words, at least part of the electronic component 509 constitutes a protrusion out of the otherwise planar back surface of the support plate 402. In its completely assembled configuration the semiconductor radiation detector comprises a cavity for the electronic component 509 in the stack comprising the support plate 402, the joint plate 408, and the bonding plate 406. In particular, the cavity is at least partly defined by the appearance of the joint plate 408. In other words, despite the protrusion constituted by the electronic component 509, the joint plate 408 can be laid flat against the back surface of the support plate 402; the electronic component 509 will be accommodated in a cavity.

In the embodiments of FIGS. 5 and 6 the ring-formed appearance of the joint plate 408 defines the cavity: in assembled configuration, a cylindrical empty space remains inside the semiconductor radiation detector. The flat ends of said cylindrical empty space are the back and front surfaces of the support plate 402 and the bonding plate 406 respectively, and the joint plate 408 defines its outer perimeter. From the manufacturing point of view it is most advantageous to make the joint plate 408 without any concave surface forms. A direct, preferably round through-hole like in FIGS. 5 and 6 is much easier to make than e.g. some concave indent in the front surface of the joint plate 408 that would accommodate the electronic component 509.

FIGS. 5 and 6 also illustrate some advantageous ways of making the electric connections between the detector chip 401 and the support plate 402. It is possible that the back surface of the detector chip 401 comprises relatively intricate patterns that are required for making the detector chip operate properly. Such intricate patterns may place strict requirements for the accuracy at which connections to it are made. Wire bonding, due to its inherent requirement of only relatively small contact pads, is a very advantageous selection for making electric connections to the back surface of the detector chip 401. We may use the designation "second wire bonded connections", in order not to confuse with the first wire bonded connections between the contact pins 405 and the bonding plate 406.

The support plate 402 defines one or more openings, through which at least some of the second wire bonded connections go in FIGS. 5 and 6. In the embodiment of FIG. 5 the support plate 402 has two openings, one of which is circular and concentric with the overall circular outline of the support plate 402. These are not requirements of the invention, but the support plate could comprise more openings, and any opening in the support plate may have other than circular form and other than concentric location.

It is, however, advantageous to have certain coordination between the second wire bonded connections (if any) that go through the opening(s) in the support plate 402 and the appearance of the joint plate 408. An end of a second wire bonded connection on the back surface of the support plate 402 inevitably constitutes a protrusion just like the electronic component 509, so it is advantageous to have it accommodated in a cavity in the stack of support-, joint-, and bonding plates of a completely assembled semiconductor radiation detector. For example the wire bonded connection 514, which illustrates schematically a connection to a ground plate or outer ring (not separately shown) on the back surface of the detector chip, is placed so close to an outer edge of the support plate 402 that the protruding end of the wire bonded connection 514 is accommodated in the "cavity" or free space that remains outside the joint plate 408 in the assembled detector.

One difference between the embodiments of FIG. 5 and FIG. 6 concerns the implementation of the bonding plate. In the embodiment of FIG. 5 the bonding plate 406 is a separate, electrically insulating plate attached to an opposite side of the thermoelectric cooler 404 than the base plate 403. In the embodiment of FIG. 6 the bonding plate 601 is a plate in the structure of the thermoelectric cooler 404, located at an opposite extremity of the thermoelectric cooler 404 than the base plate 403. An embodiment such as that illustrated in FIG. 5 is more advantageous especially if the thermoelectric cooler 404 is of the conventional type, the horizontal dimension of which becomes progressively smaller towards the top. Also the use of a separate bonding plate like in FIG. 5 allows using standard elements from the market as thermoelectric coolers without any modifications.

In FIG. 5 we assume that the electric connections to and from the thermoelectric cooler 404 go through dedicated contact pins 515 and 516, which can be (but do not have to be) made shorter than the other contact pins, because they need not reach up to the level of the bonding plate 406. There may be connections also through the bonding plate; for example reference designator 510 illustrates a conductive via through the bonding plate 406, through which an electric connection can be made to the back surface of the bonding plate 406 where a ground plane could appear to guard against possible interference from the thermoelectric cooler 404.

By comparing FIG. 5 and FIG. 6 it is easy to perceive how the invention allows having a relatively large detector chip in the semiconductor radiation detector. The contact pins 405 define a rim; in particular a circular rim in this case. The edges of the sandwiched arrangement of the detector chip 401 and the support plate 402 extend further away than said rim from the cylindrical axis of essential symmetry of the semiconductor radiation detector, which means that an active area on the front side of the detector chip is larger than the area encircled by the rim.

FIG. 5 also shows one possible way of making an electric connection to the front side of the detector chip 401. Such a connection is often needed for properly biasing the detector chip, so that the electric field inside the semiconductor material has suitable form and intensity for driving radiation-induced signal charges to appropriate locations. The fourth conductive track 507 on the back side of the support plate 402 ends at a conductive via 511, through which an electric connection is made to a contact pad (hidden from view in FIG. 5) on the front side of the support plate 402. A cut 512 in one edge of the detector chip 401 leaves a sufficient portion of the support plate front surface free so that a wire bonded connection 513 can be made from said contact pad to a corresponding contact pad (also hidden from view in FIG. 5) on the front surface of the detector chip 401. Instead of the cut 512 also a hole through the detector chip could be used for bonding, or there could be a conductive via through the detector chip.

Figure 7:
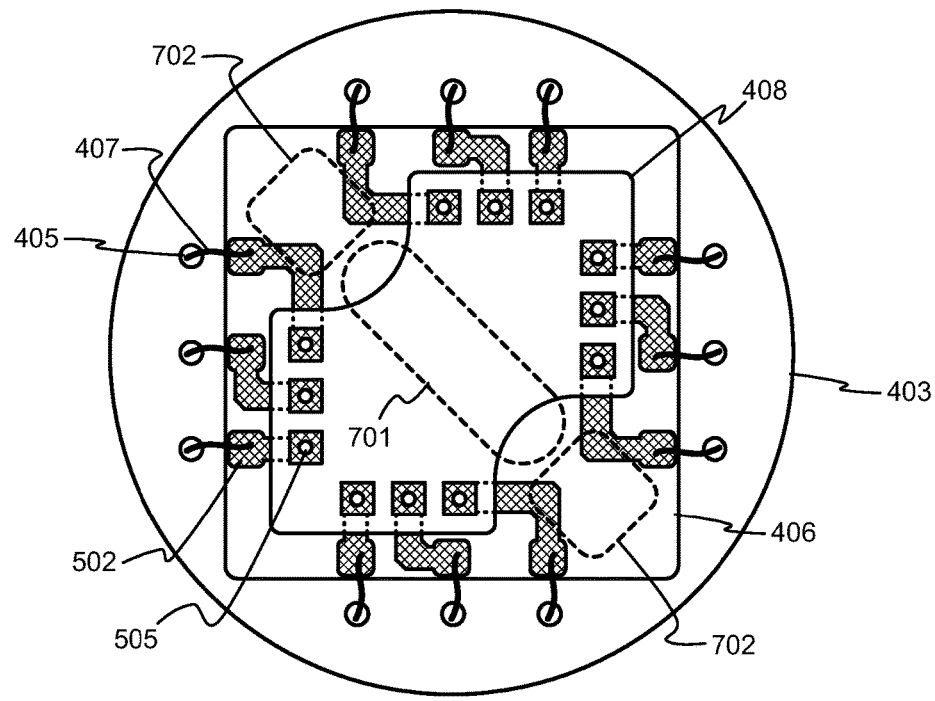
FIG. 7 illustrates a possible appearance of a joint plate attached to a bonding plate.

The invention does not require the overall form of the semiconductor radiation detector to be circular. The detector chip can be triangular, rectangular, hexagonal, or octagonal, or it may have any form that is the most convenient for a particular purpose. The same goes for the other plate-formed layers of the structure, and not all plate-formed layers need to have the same overall form. FIG. 7 is a top view of a partially disassembled semiconductor radiation detector, from which the detector chip and support plate have been removed. The base plate 403 is circular, and the bonding plate 406 is essentially square. The smaller, somewhat hourglass-shaped element on top of the bonding plate 406 is the joint plate 408. The top ends of twelve contact pins 405 appear in four groups of three, one such group being adjacent to each side of the square-formed bonding plate 406.

Earlier it was pointed out that the contact pins can be considered to define a rim, the size of which can be compared to the active area of the corresponding detector chip. The rim could be defined either by drawing straight lines between each pair of neighboring contact pins (in which case the rim will be octagonal in FIG. 7) or by drawing imaginary straight lines along each group of linearly aligned contact pins and using the intersecting points of these imaginary straight lines as the corners of the rim (in which case the rim will be square in FIG. 7).

The connections that were called first wire bonded connections 407 earlier are shown between the contact pins 405 and the bonding plate 406. The first wire bonded connections 407 lead to contact pads 502 on the front surface of the bonding plate 406, and conductive tracks run from them to suitable locations under the joint plate 408. Conductive vias 505 in the joint plate lead to its front side, from which soldered or conductively glued connections could be made further to a support plate (not shown in FIG. 7).

The dashed patterns in FIG. 7 illustrate some exemplary features that a support plate (with a detector chip attached to it, and possibly with one or more electronic components protruding out of its back surface) could have, if one was attached to the joint plate 406. Such support plate could have an oval opening in the middle, as illustrated with the dashed oval 701. The protruding electronic component(s) could be located in at least one of the areas 702 that are left free by the waist of the hourglass-shaped joint plate 408. Thus also in this case in an assembled semiconductor radiation detector the cavity, which houses the electronic component(s) in the stack comprising the support plate, the joint plate, and the bonding plate, is at least partly defined by the outline of the joint plate 408.

One of the tasks of the stacked plates (the support-, joint-, and bonding plates) is to conduct heat from the detector chip to the thermoelectric cooler. For creating a short and effective path of heat conduction, an hourglass form like that shown in FIG. 7 may be more advantageous than the ring form illustrated in FIG. 5. In general, a corresponding principle of selecting the form of the joint plate can be described as selecting a form in which as much solid substance as possible is located along the shortest path between the detector chip and the portion of the bonding plate behind which the TEC is located. The same principle could be characterized in other words as selecting a joint plate form in which cuts and/or holes, which serve the purpose of forming one or more cavities that accommodate the protruding electronic components and/or bonding connections on the back side of the support plate, are as far as possible from the shortest path between the detector chip and the portion of the bonding plate behind which the TEC is located. Yet another characterization is maximizing the cross-sectional area of the joint plate through which heat can be directly conducted from the support plate to the bonding plate through no longer distance than the thickness of the joint plate.

Figure 8:
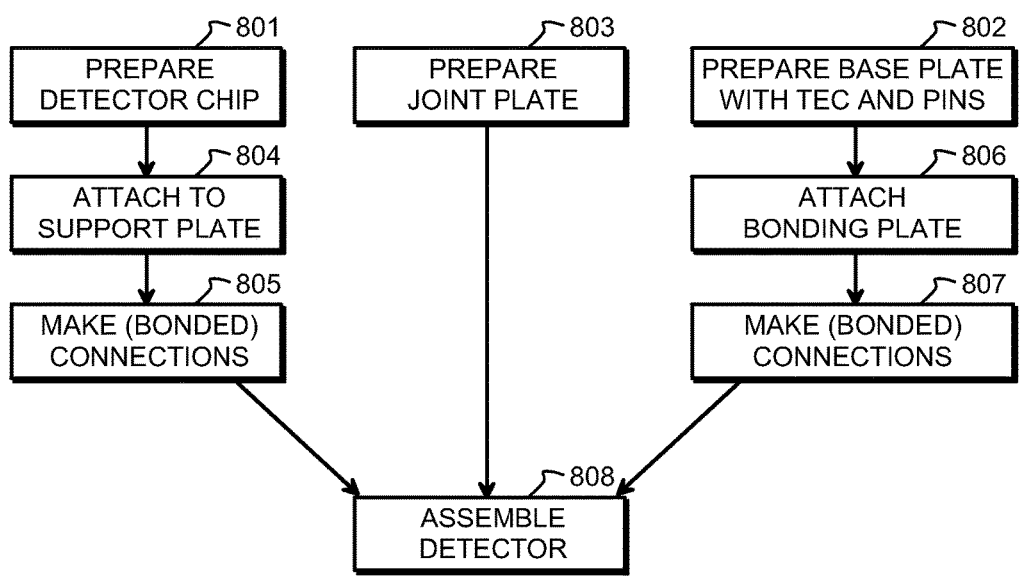
FIG. 8 illustrates a method for manufacturing a semiconductor radiation detector.

FIG. 8 is a schematic illustration of a method for manufacturing a semiconductor radiation detector. Step 801 comprises preparing a detector chip, which includes all such steps as manufacturing a semiconductor wafer, patterning the wafer with ion implantation and/or patterned layer deposition techniques, and cutting the detector chip to appropriate size. These preparatory steps may take place in any known way, and are not of importance to the present invention. Similarly step 802 comprises preparing a sub-assembly that comprises a base plate, a thermoelectric cooler attached to it, and contact pins protruding from the base plate. Also these preparatory steps may take place in any known way, and are not of importance to the present invention.

Step 803 comprises preparing a joint plate, which includes selecting the appropriate form, preparing the joint plate body of a material that is electrically insulating but thermally conductive, preparing the required conductive vias (if any), and preparing the contact points and conductive patterns on the various surfaces of the joint plate that are needed to lead the desired electric connections through the joint plate. The material of the joint plate is preferably a ceramic material that can be used under vacuum conditions.

Step 804 comprises attaching the detector chip to a support plate. Flip-chip bonding can be used for the attachment, but also other techniques are possible, such as glueing. If the attachment as such is not meant to produce electrically conductive couplings, glueing should be made with an electrically insulating glue. The making of electric connections between the detector chip and the support plate is shown as a separate step 805. Especially if not all electric connections were already made through flip-chip bonding in the attachment step, the connection-making step 805 may comprise wire bonding. Also, if an electronic component such as a FET was not attached to the support plate earlier, it can be attached as a part of step 805 together with the creation of the required (typically wire bonded) connections that are needed to effectively use the electronic component.

After step 804 the detector chip and the support plate still constitute a relatively simple planar entity, to which it is easy to make wire bonded connections from both sides. The thickness of both the detector chip and the support plate is typically less than one millimeter each, which means that for example wire bonding from the front surface of the support plate to the front surface of the detector chip (see connection 513 in FIG. 5), or wire bonding from the back surface of the support plate to the back surface of the detector chip through an opening or cut in the support plate, or even wire bonding from the back surface of a FET on the support plate to the back surface of the detector chip, is well within the range of allowable differences of height in wire bonding. Making connections this way could be characterized as wire bonding contact points on the back side of the detector chip to contact points on the support plate.

Step 806 comprises attaching a bonding plate to the sub-assembly that was prepared in step 802. Step 806 is trivial if one uses a plate in the structure of the thermoelectric cooler as a bonding plate, because in such case it comprises essentially only renaming such plate in the structure of the TEC as the bonding plate. If a separate, electrically insulating plate is used as a bonding plate, step 806 comprises attaching it to an opposite side of the thermoelectric cooler than the base plate. Soldering and glueing are examples of suitable attaching techniques. Electric connections to and from the TEC can also be made at this step, for example by wrapping the free end of each wire coming from the TEC tightly around a dedicated contact pin.

Step 807 comprises making wire-bonded connections between the bonding plate and the contact pins. The top ends of the contact pins are preferably at the same level, plus or minus not more than one millimeter, as the front surface of the attached bonding plate, so wire bonding is easily made from the front direction of the sub-assembly. Basically it would be possible to make the wire bonding also from the side direction, but such an orientation could easily make the wire bonding step more complicated with little or no additional advantage gained.

Assembling the semiconductor radiation detector at step 808 comprises using the joint plate as an intermediate plate to mechanically and electrically connect the support plate to the bonding plate. It may comprise aligning an electronic component, which is attached to the opposite side of the support plate than the detector chip, with a cavity in the stack of the support plate, the joint plate, and the bonding plate. Such cavity is at least partly defined by the appearance of the joint plate. Making the attachment at step may comprise any or any combination of the following:

glueing the joint plate to the support plate with electrically conductive glue,
soldering contact points on the joint plate to contact points on the support plate,
glueing the joint plate to the bonding plate with electrically conductive glue,
soldering contact points on the joint plate to contact points on the bonding plate.

Variations and modifications to the embodiments described above are possible without parting from the scope of protection defined by the appended claims. For example, the invention does not require that all external electric contacts to the contact pins should be made only at their free ends that protrude from the back side of the base plate; in some cases it could be advantageous to use a patterned base plate, the surface or some intermediate layer of which could carry electric connections to and from one or more of the contact pins. The invention does not require making the joint plate of exactly one piece, but two or more pieces could be used to make the joint plate. Enclosing the semiconductor radiation detector in a detector can or other kind of casing, and pumping a vacuum inside such a casing, could follow the assembling step 808 in the manufacturing method of FIG. 8.

I claim:

1. A semiconductor radiation detector, comprising:
a detector chip having a front side and a back side,
a support plate on the back side of the detector chip, having electric connections with said detector chip, a base plate having a thermoelectric cooler attached to it and contact pins protruding from the base plate towards said detector chip, a bonding plate on an opposite side of said thermoelectric cooler than said base plate, first wire bonded connections between said contact pins and said bonding plate, a joint plate between said bonding plate and said support plate, said joint plate comprising an intermediate layer in the stack of plates such that the support plate is attached to the joint plate which in turn is attached to the bonding plate, and electric connections between said support plate and said bonding plate through said joint plate.

2. The semiconductor radiation detector according to claim 1, wherein:

the electric connections between said detector chip and said support plate comprise second wire bonded connections on the back side of said detector chip, wherein at least one of said second wire bonded connections goes through an opening in said support plate.

3. The semiconductor radiation detector according to claim 1, comprising:

an electronic component attached to the opposite side of said support plate than said detector chip, and a cavity for said electronic component in a stack comprising said support plate, said joint plate, and said bonding plate;

wherein said cavity is at least partly defined by the appearance of the joint plate.

4. The semiconductor radiation detector according to claim 3, wherein said cavity is at least partly defined by a hole through said joint plate.

5. The semiconductor radiation detector according to claim 3, wherein said cavity is at least partly defined by the outline of said joint plate.

6. The semiconductor radiation detector according to claim 1, wherein at least one of the electric connections between said support plate and said bonding plate through said joint plate goes through a conductive via in said joint plate.

7. The semiconductor radiation detector according to claim 1, wherein at least one of the electric connections between said support plate and said bonding plate through said joint plate goes through a conductive track on a surface of said joint plate.

8. The semiconductor radiation detector according to claim 1, wherein said bonding plate is a separate, electrically insulating plate attached to an opposite side of the thermoelectric cooler than said base plate.

9. The semiconductor radiation detector according to claim 1, wherein said bonding plate is a plate in the structure of the thermoelectric cooler at an opposite extremity of the thermoelectric cooler than said base plate.

10. The semiconductor radiation detector according to claim 1, wherein:

said contact pins define a rim, and an active area on the front side of said detector chip is larger than the area encircled by said rim.

\* \* \* \* \*